United States Patent [19]

Negoro

[11] Patent Number: 5,304,841
[45] Date of Patent: Apr. 19, 1994

[54] LEAD FRAME

[75] Inventor: Atsuhito Negoro, Kyoto, Japan

[73] Assignee: Rohm Co., Ltd., Kyoto, Japan

[21] Appl. No.: 45,892

[22] Filed: Apr. 12, 1993

[30] Foreign Application Priority Data

Aug. 10, 1992 [JP] Japan .................................. 4-235259

[51] Int. Cl.[5] ...................... H01L 23/48; H01L 29/44; H01L 29/52; H01L 29/60
[52] U.S. Cl. ................................... 257/667; 257/670; 257/666
[58] Field of Search ............... 257/666, 667, 670, 671; 437/217, 220

[56] References Cited

U.S. PATENT DOCUMENTS 4,301,464 11/1981 Otsuki et al. ......................... 257/670

FOREIGN PATENT DOCUMENTS 3-188655 8/1991 Japan .................................. 437/220

Primary Examiner—Rolf Hille
Assistant Examiner—S. V. Clark
Attorney, Agent, or Firm—Brumbaugh, Graves, Donohue & Raymond

[57] ABSTRACT

A lead frame for a rectangular flat package has dumb bars connecting the lead terminals and dam bar coupling portions at the corners of the frame in which the coupling portions are notched to permit the adjacent dam bars to have the same length as the other dam bars, permitting them to be cut away by the same punch. This arrangement permits an increase in the length of the nicked part of the corner of the resin body of the flat package, at which a gate for injection-molding of a resin is located, thereby avoiding chipping of the resin body when excess resin from the injection is removed.

2 Claims, 1 Drawing Sheet

LEAD FRAME

BACKGROUND OF THE INVENTION

This invention relates to lead frames for molded rectangular flat packages having lead terminals extending outwardly through the sides of a resin body.

FIG. 2 shows a corner of a conventional lead frame 3 for a rectangular flat package which has a gate 5 for injecting a molding resin to provide a resin body 2 for the package. The corner of the resin body 2 has a nicked part 2a corresponding to the corner of the lead frame 3. Since the length of the nicked part 2a is small, the length $r_1$ of each of two dam bars 1a and 1b of the lead frame adjacent to that corner can be made as large as that of each of the other dam bars 1c and 1d of the frame. The molding resin is injected into a cavity between an upper and a lower molding die through the gate 5 located at the bottom of the dam bar coupling portion 4 of the lead frame 3. Although some of the injected resin leaks through the boundary between the dies at the nicked part 2a of the corner of the molded portion 2 during the transfer molding, the dam bar coupling portion of the lead frame has a resin-blocking part 4a with a length $r_3$ which extends along the nicked part and can be made at least equal to the length of the nicked part to enable the resin-stoppage part to prevent the leaking resin from spreading. With that arrangement, the length $r_1$ of each of the dam bars 1a and 1b can be the same as the length $r_2$ of the dam bars 2a and 2b. FIG. 2 shows four lead terminals 6 coupled together by the dam bars 1a, 1b, 1c and 1d and a central portion 7 of the lead frame.

However, because the length of the nicked part 2a is made small enough to make it possible to equalize the length $r_1$ of each of the dam bars 1a and 1b to the length $r_2$ of each of the other dam bars 1c and 1d, this conventional type of lead frame is unsatisfactory. This is because the short nicked part is likely to chip when the portion of the resin which leaked and has hardened on the nicked part at the gate 5 is removed after injection-molding the resin body 2. If the length of the nicked part 2a is increased to solve this problem, the length $r_3$ of the resin-stoppage part 4a of the dam bar coupling portion 4, which extends along the nicked part, must be increased to be the same as that of the nicked part. As a result, the length $r_1$ of each of the dam bars 1a and 1b at the corner of the molded portion 2 cannot be made as large as the length $r_2$ of the other dam bars 1c and 1d as shown in FIG. 3. This will result in another problem since the dam bars 1a and 1b cannot be cut off by a dam bar punch 10 having a width corresponding to the length of each of the other dam bars 1c and 1d, because the punch would partially cut into the dam bar coupling portion 4 when it is operated.

SUMMARY OF THE INVENTION

Accordingly, it is an object of the present invention to provide a lead frame which overcomes the disadvantages of the prior art.

Another object of the invention is to provide a lead frame for a rectangular flat package in which the cut-off of the dam bars of the frame is not affected by an increase in the length of the nicked part of the corner of the resin body of the flat package.

These and other objects of the invention are attained by providing a lead frame for a rectangular flat package having lead terminals which extend outwardly through the sides of a resin body in which a dam bar coupling portion located at a gate for the injection molding of a resin has notches provided so that the length of each of the dam bars connected by the coupling portion can be equal to that of each of the other dam bars in the lead frame.

Since the dam bar coupling portion of the lead frame in accordance with the present invention has notches which permit the length of each of the dam bars coupled together by the coupling portion to be equal to that of the other dam bars in the lead frame, all of the dam bars can be cut off by a dam bar punch of the same size. Because of the presence of the notches, the resin-blocking part of the dam bar coupling portion, which extends along the nicked part at one corner of the rectangular flat package, can be increased in length without affecting the cut-off of the dam bars. For that reason, the nicked part can be increased in length.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENT

Figure 1:
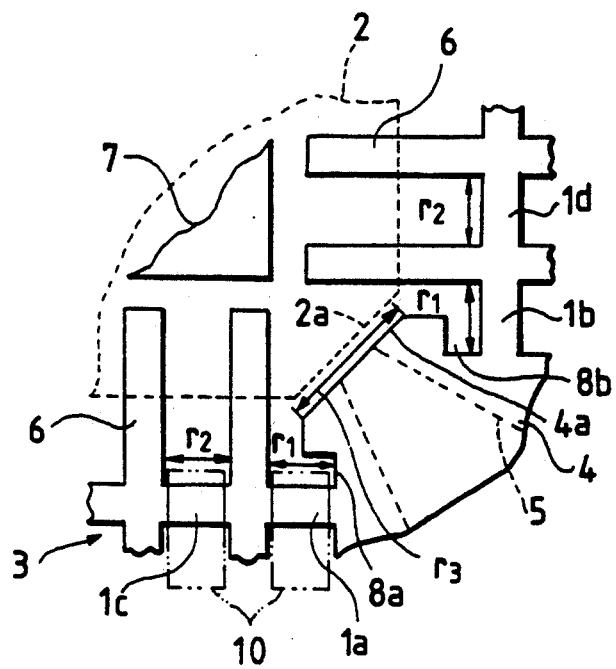
FIG. 1 is a plan view of a portion of a representative lead frame arranged in accordance with the present invention embodied in a rectangular flat package.
Figure 2:
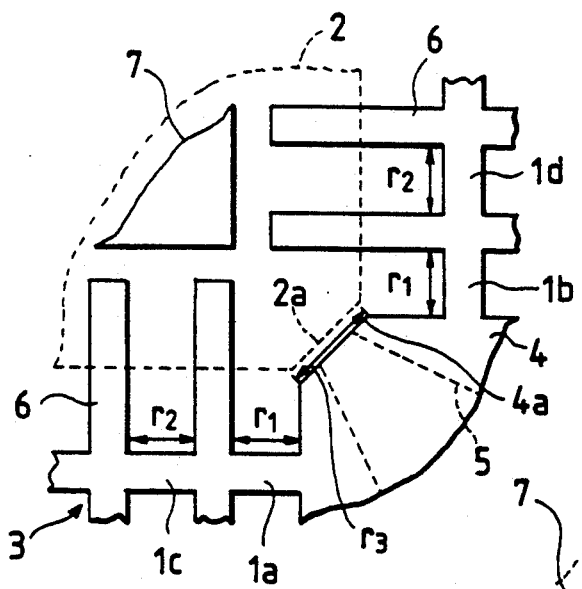
FIG. 2 is a plan view of a portion of a conventional lead frame for a rectangular flat package.
Figure 3:
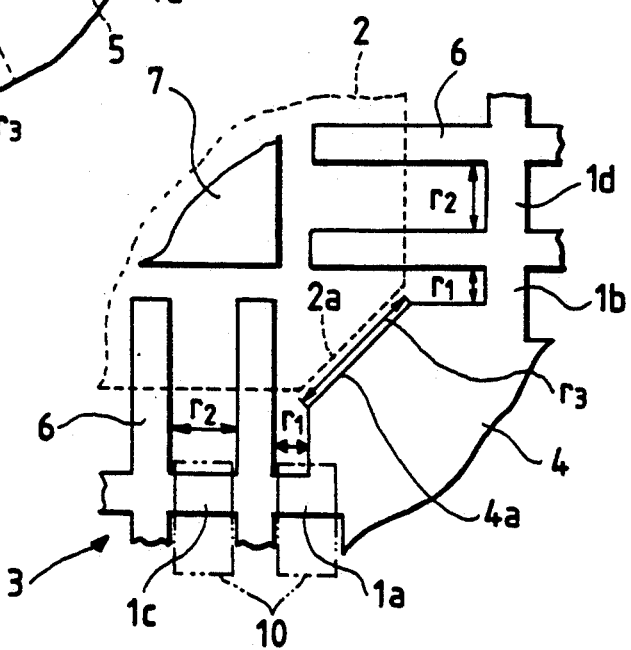
FIG. 3 is a plan view of a portion of another conventional lead frame for a rectangular flat package having a nicked part of increased length at the corner of the resin body.

In the typical embodiment of the invention shown in FIG. 1, one corner of a lead frame 3 for a rectangular flat package is positioned at a gate 5 for injecting a resin to make a resin body 2 for the package. The lead frame 3 is arranged to permit the length of the nicked part 2a of the corner of the molded portion 2 to be larger than that of the conventional rectangular flat package described above. As a result, the length $r_3$ of the resin-stoppage part 4a of the dam bar coupling portion 4 of the lead frame 3, which extends along the nicked part 2a, can be as large as that of the nicked part. The frame 3 is formed with notches 8a and 8b in the coupling portion 4 which are positioned so that the length $r_1$ of each of the dam bars 1a and 1b which are connected by the coupling portion 4 is equal to the length $r_2$ of each of the other dam bars 1c and 1d.

To manufacture the resin body 2 of the rectangular flat package, resin is injected into a cavity between upper and lower molding dies through the gate 5 located at the bottom of the dam bar coupling portion 4 of the lead frame 3, and the injected resin hardens to form the resin body. During the injection, a part of the injected resin leaks through the boundary between the upper and lower molding dies at the nicked part 2a of the resin body 2, but the resin-stoppage part 4a of the dam bar coupling portion 4 prevents the leaking resin from spreading. After the resin body 2 is thus manufactured, the resin which has leaked out at the gate 5 and hardened is removed from the resin body. When it is removed, the resin body 2 does not chip at the nicked part 2a at the corner of the body because the length of the nicked part has been made large enough to avoid chipping.

After the resin body 2 is manufactured, each dam bar in the lead frame 3 is removed by a dam bar punch 10. Since the length of the dam bars 1a and 1b is equal to that of each of the other dam bars 1c and 1d because of the presence of the notches 8a and 8b, the punch 10 can cut off each of the former dam bars without cutting into the dam bar coupling portion 4, as shown in FIG. 1.

The lead frame 3 which has been described above as to the dam bar coupling portion 4 and the adjacent region, which are located at the corner of the molded portion 2 near the gate 5, may have the same arrangement at the dam bar coupling portions of the frame and the adjacent regions located at the other three corners of the resin body.

Thus, the present invention provides a lead frame for a rectangular flat package which has notches in the dam bar coupling portion of the frame so that the length of each of the dam bars coupled together by the coupling portion is equal to that of each of the other dam bars. For that reason, each of the dam bars can be removed by the same dumb bar punch. Because of the presence of the notches, the length of the resin-stoppage part of the dam bar coupling portion can be increased without affecting the cut-off of the dam bars. For that reason, the length of the nicked part of the corner of the resin body of the package, which is located at a gate for the injection-molding of a resin, can be increased to make it unlikely that the resin body will chip when a hardened resin part at the gate is removed from the body.

Although the invention has been described herein with reference to a specific embodiment, many modifications and variations therein will readily occur to those skilled in the art. Accordingly, all such variations and modifications are included within the intended scope of the invention.

I claim:

1. A lead frame for a rectangular flat package having lead terminals extending outwardly through the peripheral sides of a resin body comprising a lead frame having a rectangular array of lead terminals and a plurality of dam bars connecting adjacent lead terminals along each side of the lead frame, and dam bar coupling portions at the corners of the array connecting the dam bars at the ends of adjacent sides of the lead frame, at least one of the dam bar coupling portions being formed with notches at the locations where adjacent dam bars are connected to it so that the length of the dam bars connected by that coupling portions is equal to the length of each of the dam bars connecting adjacent lead terminals.

2. A lead frame for a rectangular flat package according to claim 1, wherein said notches are formed into a U-shape.

* * * * *